United States Patent
Cheng et al.

(10) Patent No.: US 9,159,834 B2
(45) Date of Patent: Oct. 13, 2015

(54) FACETED SEMICONDUCTOR NANOWIRE

(71) Applicant: International Business Machines Corporation, Armonk, NY (US)

(72) Inventors: Kangguo Cheng, Schenectady, NY (US); Juntao Li, Guilderland, NY (US); Zhen Zhang, Ossining, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 14 days.

(21) Appl. No.: 13/828,867

(22) Filed: Mar. 14, 2013

(65) Prior Publication Data

US 2014/0264279 A1   Sep. 18, 2014

(51) Int. Cl.

| | |
|---|---|
| *H01L 29/78* | (2006.01) |
| *H01L 29/66* | (2006.01) |
| *B82Y 10/00* | (2011.01) |
| *B82Y 40/00* | (2011.01) |
| *H01L 29/775* | (2006.01) |
| *H01L 29/04* | (2006.01) |

(Continued)

(52) U.S. Cl.
CPC .............. *H01L 29/7853* (2013.01); *B82Y 10/00* (2013.01); *B82Y 40/00* (2013.01); *H01L 29/045* (2013.01); *H01L 29/0673* (2013.01); *H01L 29/66439* (2013.01); *H01L 29/66772* (2013.01); *H01L 29/66795* (2013.01); *H01L 29/775* (2013.01); *H01L 29/78696* (2013.01)

(58) Field of Classification Search
CPC ..................... H01L 29/66765; H01L 27/1214; H01L 29/4908; H01L 29/66545; H01L 29/66636; H01L 29/7848; H01L 29/045; H01L 29/41791; H01L 29/785; H01L 29/7853; H01L 29/66795; H01L 29/78696; H01L 29/775; H01L 29/0673; H01L 29/66439; H01L 29/66772
USPC .......... 257/190, 192, 255, 288, 347, E21.421, 257/E29.264; 438/299, 300
See application file for complete search history.

(56) References Cited

U.S. PATENT DOCUMENTS

| | | | |
|---|---|---|---|
| 7,534,675 B2 | 5/2009 | Bangsaruntip et al. | |
| 7,671,420 B2 * | 3/2010 | Shin et al. | 257/369 |

(Continued)

OTHER PUBLICATIONS

Yang, M. et al., "Hybrid-orientation technology (HOT): opportunities and challenges" IEEE Transactions on Electron Devices (May 2006) pp. 965-978, vol. 53, No. 5.

*Primary Examiner* — Jae Lee
*Assistant Examiner* — Mohammed R Alam
(74) *Attorney, Agent, or Firm* — Scully, Scott, Murphy & Presser, P.C.; Louis J. Percello, Esq.

(57) ABSTRACT

Selective epitaxy of a semiconductor material is performed on a semiconductor fin to form a semiconductor nanowire. Surfaces of the semiconductor nanowire include facets that are non-horizontal and non-vertical. A gate electrode can be formed over the semiconductor nanowire such that the faceted surfaces can be employed as channel surfaces. The epitaxially deposited portions of the faceted semiconductor nanowire can apply stress to the channels. Further, an additional semiconductor material may be added to form an outer shell of the faceted semiconductor nanowire prior to forming a gate electrode thereupon. The faceted surfaces of the semiconductor nanowire provide well-defined charge carrier transport properties, which can be advantageously employed to provide a semiconductor device with well-controlled device characteristics.

13 Claims, 9 Drawing Sheets

(51) Int. Cl.
 H01L 29/06 (2006.01)
 H01L 29/786 (2006.01)

(56) References Cited

U.S. PATENT DOCUMENTS

| | | |
|---|---|---|
| 7,795,677 B2 | 9/2010 | Bangsaruntip et al. |
| 7,884,004 B2 | 2/2011 | Bangsaruntip et al. |
| 8,030,108 B1 | 10/2011 | Lee et al. |
| 8,399,314 B2 | 3/2013 | Cohen et al. |
| 2009/0026505 A1* | 1/2009 | Okano .................. 257/255 |
| 2010/0163838 A1* | 7/2010 | Chu-Kung et al. ........... 257/9 |
| 2010/0207209 A1* | 8/2010 | Inokuma ................ 257/347 |
| 2010/0233426 A1 | 9/2010 | Kim et al. |
| 2011/0193141 A1* | 8/2011 | Lin et al. .............. 257/255 |
| 2013/0056827 A1* | 3/2013 | Tsai et al. ............. 257/347 |
| 2013/0069128 A1* | 3/2013 | Okano ................. 257/288 |

* cited by examiner

FACETED SEMICONDUCTOR NANOWIRE

BACKGROUND

The present disclosure generally relates to semiconductor devices, and particularly to faceted semiconductor nanowires and semiconductor structures employing the same, and methods of manufacturing the same.

A conventional semiconductor nanowire is formed with a rectangular vertical cross-sectional shape and a parallel pair of vertical sidewalls, or with a rounded vertical cross-sectional shape that is obtained by a thermal anneal of a semiconductor nanowire with a rectangular vertical cross-sectional shape. The surface orientations of the parallel pair of vertical sidewalls may not be optimal for providing high charge carrier mobility for semiconductor devices such as fin field effect transistors. Surfaces of a rounded semiconductor nanowire include many different crystallographic orientations, and provide a characteristic that is an average of many different crystallographic orientations.

BRIEF SUMMARY

Selective epitaxy of a semiconductor material is performed on a semiconductor fin to form a semiconductor nanowire. Surfaces of the semiconductor nanowire include facets that are non-horizontal and non-vertical. A gate electrode can be formed over the semiconductor nanowire such that the faceted surfaces can be employed as channel surfaces. The epitaxially deposited portions of the faceted semiconductor nanowire can apply stress to the channels. Further, an additional semiconductor material may be added to form an outer shell of the faceted semiconductor nanowire prior to forming a gate electrode thereupon. The faceted surfaces of the semiconductor nanowire provide well-defined charge carrier transport properties, which can be advantageously employed to provide a semiconductor device with well-controlled device characteristics.

According to an aspect of the present disclosure, a semiconductor structure includes a semiconductor nanowire located on an insulator layer and a gate stack structure. A predominant portion of all outer surfaces of the semiconductor nanowire is a set of crystallographic facets that are not parallel to, or perpendicular to, a horizontal interface between the semiconductor nanowire and the insulator layer. The gate stack structure includes a stack of a gate dielectric and a gate electrode and straddling the semiconductor nanowire.

According to another aspect of the present disclosure, another semiconductor structure is provided. The semiconductor structure includes a substrate including an insulator layer, and a semiconductor nanowire located on a surface of the insulator layer. A predominant portion of all outer surfaces of the semiconductor nanowire is a set of crystallographic facets that are not parallel to, or perpendicular to, a horizontal interface between the semiconductor nanowire and the insulator layer.

According to yet another aspect of the present disclosure, a method of forming a semiconductor structure is provided. A semiconductor fin including a single crystalline semiconductor material is provided on a top surface of an insulator layer. A semiconductor nanowire is formed by growing a plurality of faceted semiconductor material portions on the semiconductor fin until all physically exposed surfaces of the semiconductor nanowire become faceted surfaces that contact one another or one or more dielectric surfaces.

DETAILED DESCRIPTION

As stated above, the present disclosure relates to faceted semiconductor nanowires and semiconductor structures employing the same, and methods of manufacturing the same. Aspects of the present disclosure are now described in detail with accompanying figures. It is noted that like reference numerals refer to like elements across different embodiments. The drawings are not necessarily drawn to scale. The drawings are not necessarily drawn to scale. As used herein, ordinals are employed to distinguish similar elements, and a same element may be labeled with different ordinals across the specification and the claims.

Figure 1A:
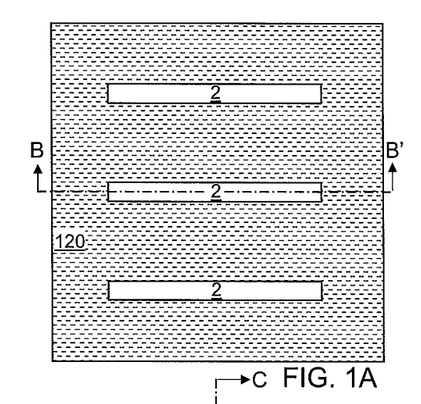
FIG. 1A is a top-down view of a first exemplary semiconductor structure after formation of semiconductor fins according to a first embodiment of the present disclosure.
Figure 1B:
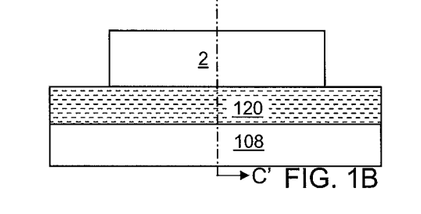
FIG. 1B is a vertical cross-sectional view of the first exemplary semiconductor structure along the plane B-B' of FIG. 1A.
Figure 1C:
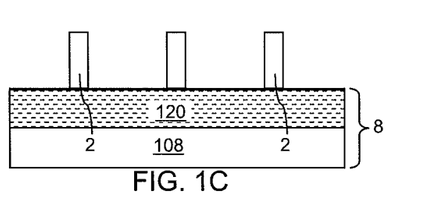
FIG. 1C is a vertical cross-sectional view of the first exemplary semiconductor structure along the plane C-C' of FIG. 1B.

Referring to FIGS. 1A-1C, a first exemplary semiconductor according to a first embodiment of the present disclosure includes a plurality of semiconductor fins 2 formed on a substrate 8. The substrate 8 can include an insulator layer 120 and a handle substrate 108. The insulator layer 120 includes a dielectric material such as silicon oxide, silicon nitride, silicon oxynitride, or a combination thereof. The handle substrate 108 can include a semiconductor material, a conductive material, a dielectric material, or a combination thereof, and provides mechanical support to the insulator layer 120 and the structures thereupon.

The plurality of semiconductor fins 2 includes a semiconductor material, which is herein referred to as a first single crystalline semiconductor material. The first single crystalline semiconductor material can be, for example, single crystalline silicon, single crystalline germanium, a single crystalline alloy of at least two of silicon, germanium, and carbon, a single crystalline compound semiconductor material, a polycrystalline elemental semiconductor material, a polycrystalline alloy of at least two of silicon, germanium, and carbon, a polycrystalline compound semiconductor material, or an amorphous semiconductor material. In one embodiment, the semiconductor material of the plurality of semiconductor fins 2 is single crystalline. In one embodiment, the plurality of semiconductor fins 2 can include a single crystalline silicon material, which can be intrinsic single crystalline silicon, p-doped single crystalline silicon, or n-doped single crystalline silicon.

The plurality of semiconductor fins 2 can be formed, for example, by providing a semiconductor-on-insulator (SOI) substrate including vertical stack of the handle substrate 108, the insulator layer 120 (which is a buried insulator layer), and a top semiconductor layer including the first single crystalline semiconductor material. The top semiconductor layer is patterned by a combination of lithographic methods and an anisotropic etch to form the plurality of semiconductor fins 2. The plurality of semiconductor fins 2 can be formed directly on the top surface of the insulator layer 120.

In one embodiment, each of the plurality of semiconductor fins 2 can include a pair of vertical sidewalls that extend along a lengthwise direction the semiconductor fin 101. As used herein, a "lengthwise direction" of an object is a direction along which the moment of inertia of the object becomes a minimum. The lengthwise direction of the plurality of semiconductor fins 2 can be a horizontal direction. In one embodiment, the plurality of semiconductor fins 2 can have a same horizontal lengthwise direction, i.e., the lengthwise directions of the plurality of semiconductor fins 2 can be parallel among each other and parallel to an interface between the insulator layer 120 and the plurality of semiconductor fins 2.

Figure 2A:
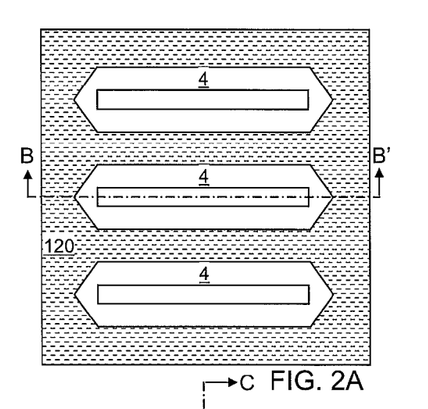
FIG. 2A is a top-down view of the first exemplary semiconductor structure after formation of faceted semiconductor material portions according to the first embodiment of the present disclosure.
Figure 2B:
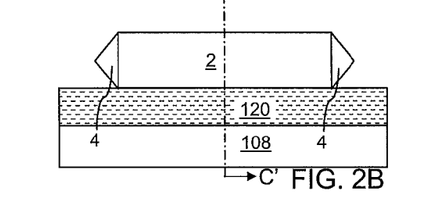
FIG. 2B is a vertical cross-sectional view of the first exemplary semiconductor structure along the plane B-B' of FIG. 2A.
Figure 2C:
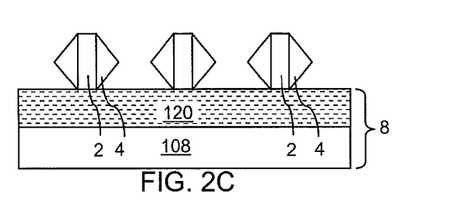
FIG. 2C is a vertical cross-sectional view of the first exemplary semiconductor structure along the plane C-C' of FIG. 2B.
Figure 3A:
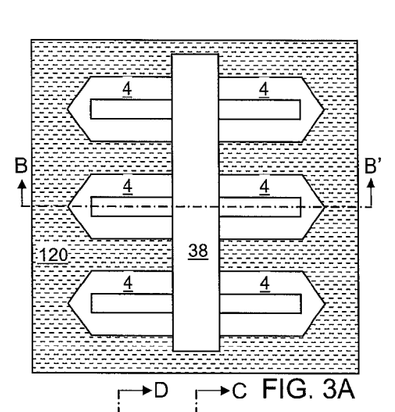
FIG. 3A is a top-down view of the first exemplary semiconductor structure after formation of a gate stack structure according to the first embodiment of the present disclosure.
Figure 3B:
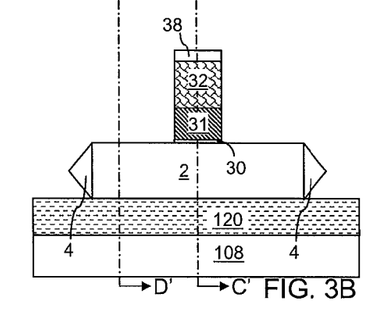
FIG. 3B is a vertical cross-sectional view of the first exemplary semiconductor structure along the plane B-B' of FIG. 3A.
Figure 3C:
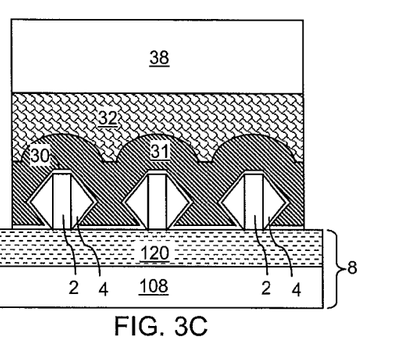
FIG. 3C is a vertical cross-sectional view of the first exemplary semiconductor structure along the plane C-C' of FIG. 3B.
Figure 3D:
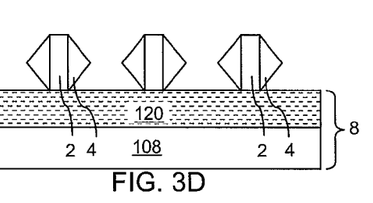
FIG. 3D is a vertical cross-sectional view of the first exemplary semiconductor structure along the plane D-D' of FIG. 3B.
Figure 4A:
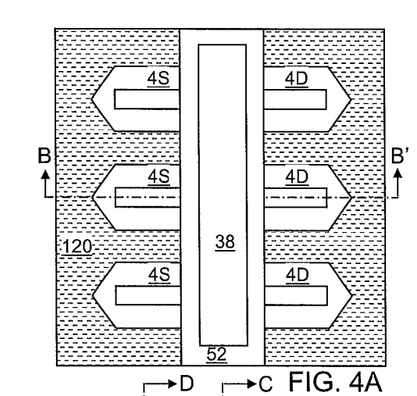
FIG. 4A is a top-down view of the first exemplary semiconductor structure after formation of a gate spacer and source and drain regions according to the first embodiment of the present disclosure.
Figure 4B:
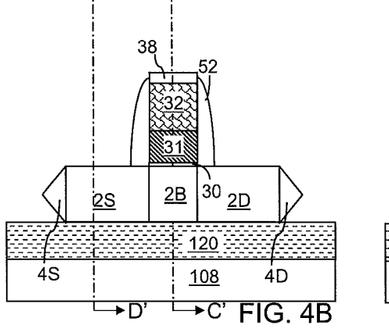
FIG. 4B is a vertical cross-sectional view of the first exemplary semiconductor structure along the plane B-B' of FIG. 4A.
Figure 4C:
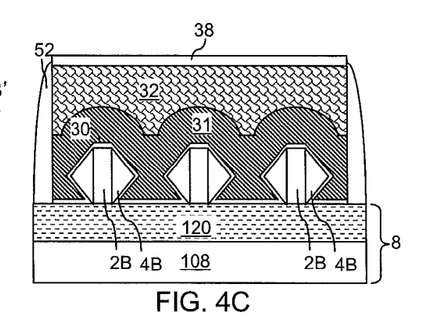
FIG. 4C is a vertical cross-sectional view of the first exemplary semiconductor structure along the plane C-C' of FIG. 4B.
Figure 4D:
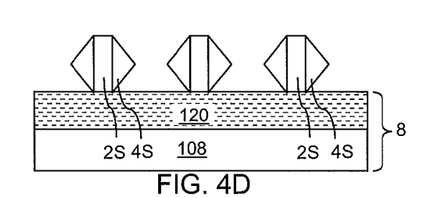
FIG. 4D is a vertical cross-sectional view of the first exemplary semiconductor structure along the plane D-D' of FIG. 4B.
Figure 5A:
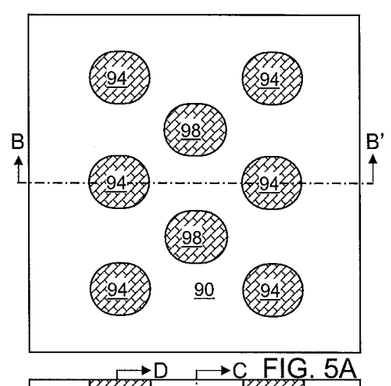
FIG. 5A is a top-down view of the first exemplary semiconductor structure after formation of a contact-level dielectric layer and various contact via structures according to the first embodiment of the present disclosure.
Figure 5B:
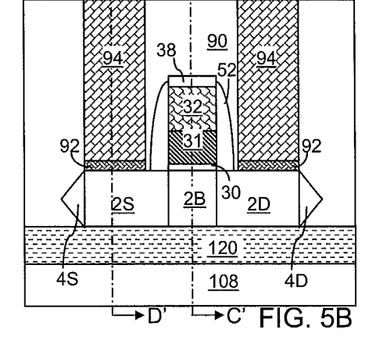
FIG. 5B is a vertical cross-sectional view of the first exemplary semiconductor structure along the plane B-B' of FIG. 5A.
Figure 5C:
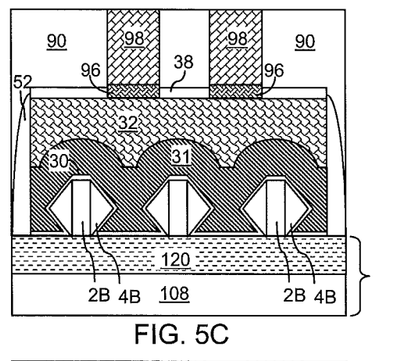
FIG. 5C is a vertical cross-sectional view of the first exemplary semiconductor structure along the plane C-C' of FIG. 5B.
Figure 5D:
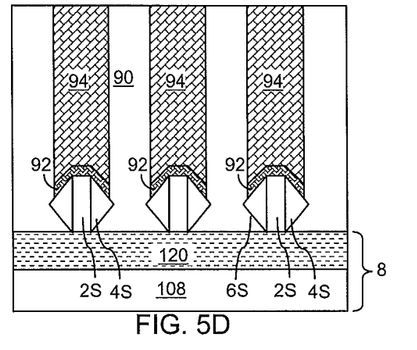
FIG. 5D is a vertical cross-sectional view of the first exemplary semiconductor structure along the plane D-D' of FIG. 5B.

Referring to FIGS. 2A-2C, a plurality of faceted semiconductor material portions 4 is grown on physically exposed surfaces of the plurality of semiconductor fins 2. The plurality of faceted semiconductor material portions 4 includes a second single crystalline semiconductor material, and grows directly on semiconductor surfaces of the plurality of semiconductor fins 2. In one embodiment, physically exposed surfaces of each faceted semiconductor material portion 4 can consist of crystallographic facets of the second single crystalline semiconductor during the growth of the plurality of faceted semiconductor material portions 4.

In one embodiment, a selective epitaxy process can be employed to grow the plurality of faceted semiconductor material portions 4. The selective epitaxy process is herein referred to as a first selective epitaxy process. During the first selective epitaxy process, the exemplary semiconductor structure including physically exposed surfaces of the plurality of semiconductor fins 2 is loaded into a process chamber, and at least one reactant precursor for the second single crystalline semiconductor material and an etchant are flowed into the process chamber. The flow rate of the at least one reactant precursor for the second single crystalline semiconductor material and the flow rate of the etchant can be time-invariant (i.e., constant as a function of time), or can be modulated as a function of time.

The flow rate of the at least one reactant precursor for the second single crystalline semiconductor material and the flow rate of the etchant are selected such that the deposition of the second single crystalline semiconductor material proceeds selectively, i.e., proceeds on semiconductor surfaces and does not proceed on dielectric surfaces. Specifically, the etch rate for any semiconductor material that may nucleate on dielectric surfaces is grater than the rate of growth of a seed semiconductor material for nucleation on the dielectric surfaces is etched immediately, and does not result in a sustainable mechanism. As such, the at least one reactant precursor does not nucleate on any dielectric surface during the selective epitaxy process.

Deposition rates of the plurality of faceted semiconductor material portions 4 can be dependent on the surface orientations of the physically exposed surfaces of the plurality of semiconductor fins 2. In one embodiment, deposition of the second single crystalline semiconductor material can proceed on all physically exposed surfaces of the plurality of semiconductor fins 2. In another embodiment, deposition of the second single crystalline semiconductor material can proceed only on a subset of surface orientations of the physically exposed surfaces of the plurality of semiconductor fins 2, and does not proceed on another subset of surface orientations of the physically exposed surfaces of the plurality of semiconductor fins 2.

In one embodiment, the plurality of faceted semiconductor material portions 4 can be deposited on all surfaces of the at least one pair of vertical sidewalls of the plurality of semiconductor fins 2. In one embodiment, each of the faceted surfaces can become adjoined to at least another of the faceted surfaces upon completion of the selective epitaxy process. As used herein, a first surface adjoins a second surface when an edge of the first surface coincides with an edge of the second surface.

The selective epitaxy process can be performed in a process chamber for a duration of time. In one embodiment, all of physically exposed surfaces of the plurality of faceted semiconductor material portions can become faceted surfaces having crystallographically equivalent orientations. In one embodiment, the faceted surfaces of the plurality of faceted semiconductor material portions 4 are not parallel to, or perpendicular to, the top surface of the insulator layer 120. In one embodiment, the crystallographically equivalent orientations of the faceted surface of the plurality of faceted semiconductor material portions 4 are {111} orientations. As used herein, {hkl}, in which each of h, k, and l represents independent integers, orientations refer to a set of crystallographic orientations that are equivalent to a (hkl) orientation by crystal symmetry of a single crystalline material.

In one embodiment, the top surface(s) of the plurality of semiconductor fins 2 can include one of {001} surfaces and sidewalls of the plurality of semiconductor fins 2 can include {110} surfaces or {100} surfaces. In this case, the crystallographically equivalent orientations of the faceted surface of the plurality of faceted semiconductor material portions 4 can be {111} orientations.

In another embodiment, the top surface(s) of the plurality of semiconductor fins 2 can include one of {110} surfaces and sidewalls of the plurality of semiconductor fins 2 can include {001} surfaces or {110} surfaces. In this case, the crystallographically equivalent orientations of the faceted surface of the plurality of faceted semiconductor material portions 4 can be {111} orientations.

The first single crystalline semiconductor material and the second single crystalline semiconductor material can have the same composition or different compositions. In one embodiment, the first single crystalline semiconductor material can be single crystalline silicon, and the second single crystalline semiconductor material can be a single crystalline silicon-germanium alloy. In this case, the second single crystalline semiconductor material can apply a tensile stress to the first single crystalline semiconductor material in the plurality of semiconductor fins 2. In one embodiment, an atomic concentration of germanium in the second single crystalline semiconductor material can be in a range from 10% to 50%. In one embodiment, the first single crystalline semiconductor material can include silicon at an atomic concentration of at least 90%. In one embodiment, the first single crystalline semiconductor material can be doped or undoped silicon, or a doped or undoped silicon-germanium alloy in which the atomic concentration of silicon is at least 90%. In one embodiment, the first single crystalline semiconductor material can consist of silicon or consist of silicon and at least one electrical dopant. If the first single crystalline semiconductor material include a semiconductor material having a lattice constant lesser than the lattice constant of the second single crystalline semiconductor material, the second single crystalline semiconductor material in the plurality of faceted semiconductor material portions 4 can be under compressive strain. Channels to be formed in the plurality of faceted semiconductor material portions 4 can be under compressive strain, and the mobility of charge carriers therein is changed due to the compressive strain. In one embodiment, the compressive strain can be a biaxial compressive strain within a plane that is parallel to the most proximate faceted surface of the semiconductor nanowire (2, 4). In one embodiment, the change in the mobility of charge carriers can be advantageously employed to increase the on-current of a field effect transistor. In one embodiment, p-type field effect transistors can be formed employing semiconductor shell regions 6 under compressive strain.

In another embodiment, the first single crystalline semiconductor material can be a single crystalline silicon-germanium alloy, and the second single crystalline semiconductor material can be single crystalline silicon. In this case, the second single crystalline semiconductor material can apply a compressive stress to the first single crystalline semiconductor material in the plurality of semiconductor fins 2. In one embodiment, an atomic concentration of germanium in the first single crystalline semiconductor material can be in a range from 10% to 50%. In one embodiment, the second single crystalline semiconductor material can include silicon at an atomic concentration of at least 90%. In one embodiment, the second single crystalline semiconductor material can be doped or undoped silicon, or a doped or undoped silicon-germanium alloy in which the atomic concentration of silicon is at least 90%. In one embodiment, the second single crystalline semiconductor material can consist of silicon or consist of silicon and at least one electrical dopant. If the first single crystalline semiconductor material include a semiconductor material having a lattice constant lesser than the lattice constant of the second single crystalline semiconductor material, the second single crystalline semiconductor material in the plurality of faceted semiconductor material portions 4 can be under tensile strain. Channels to be formed in the plurality of faceted semiconductor material portions 4 can be under tensile strain, and the mobility of charge carriers therein is changed due to the tensile strain. In one embodiment, the tensile strain can be a biaxial tensile strain within a plane that is parallel to the most proximate faceted surface of the semiconductor nanowire (2, 4). In one embodiment, the change in the mobility of charge carriers can be advantageously employed to increase the on-current of a field effect transistor. In one embodiment, p-type field effect transistors can be formed employing semiconductor shell regions 6 under tensile strain.

In yet another embodiment, the semiconductor composition of the first single crystalline semiconductor material can be the same as the semiconductor composition of the second single crystalline semiconductor material. As used herein, a "semiconductor composition" of a semiconductor material refers to a composition of the semiconductor material less all electrical dopants, i.e., p-type dopants or n-type dopants, within the semiconductor material. In other words, a semiconductor composition of a semiconductor material refers to the composition of an intrinsic equivalent of the semiconductor material. In one embodiment, the semiconductor composition of the first single crystalline semiconductor material and the semiconductor composition of the second single crystalline semiconductor material can consist of silicon, or can consist of silicon and carbon. In another embodiment, the semiconductor composition of the first single crystalline semiconductor material and the semiconductor composition of the second single crystalline semiconductor material can consist of silicon and germanium, or can consist of silicon, germanium, and carbon.

In still another embodiment, one or both of the first and second single crystalline semiconductor material can include a compound semiconductor material.

In one embodiment, the at least one reactant precursor can include at least one silicon-containing precursor and/or at least one germanium-containing precursor. For example, the at least one silicon-containing precursor can include at least one of $SiH_4$, $SiH_2Cl_2$, $SiHCl_3$, $SiCl_4$, and $Si_2H_6$. The at least one germanium-containing precursor can include at least one of $GeH_4$ and $Ge_2H_6$. The etchant can include HCl.

In one embodiment, the molar ratio of the at least one reactant precursor (i.e., all of the at least one reactant precursor) to the etchant is in a range from 2:1 to 1:10 in the process chamber during the selective epitaxy process. The pressure of the selective epitaxy process is maintained in a range that provides differential growth rates for different crystallographic surfaces of the second single crystalline semiconductor material. In one embodiment, the partial pressure of the etchant can be in a range from 1 Torr to 50 Torr, and the partial pressure of all of the at least one reactant precursor is in a range from 0.1 Torr to 10 Torr, although lesser and greater partial pressures can also be employed for the etchant and/or the at least one reactant precursor.

At least one carrier gas may optionally be employed. Exemplary gases that may be employed as a carrier gas include, but are not limited to, hydrogen, nitrogen, helium, and argon. The total pressure in the process chamber can be in a range from 5 Torr to 200 Torr, although lesser and greater total pressures can also be employed.

The temperature of the process chamber during the selective epitaxy process can be in a range from 600° C. to 900° C., although lesser and greater temperatures can also be employed.

In one embodiment, the lateral spacing among the plurality of semiconductor fins 2 and the growth of the plurality of faceted semiconductor material portions 4 can be controlled such that faceted semiconductor material portions 4 formed on different semiconductor fins 2 do not contact each other. In this case, a subset of the plurality of faceted semiconductor material portions 4 that are formed directly on one of the plurality of semiconductor fins 2 does not contact any other subset of the plurality of faceted semiconductor material portions 4 that are formed directly on any other of the plurality of semiconductor fins 2. This feature can be advantageously employed to prevent electrically shorting a plurality of semiconductor fins 2 while providing an additional semiconductor material to each semiconductor fin 2 through selective epitaxy of the second single crystalline semiconductor material.

In one embodiment, an anneal at an elevated temperature can be optionally employed to interdiffuse semiconductor materials across interfaces between the plurality of semiconductor fins 2 and the plurality of faceted semiconductor material portions 4. The temperature of the anneal can be, for example, in a range from 800° C. to 1,100° C. In this case, the semiconductor materials in the plurality of semiconductor fins 2 and the plurality of faceted semiconductor material portions 4 can be partially, or completely, homogenized.

Each contiguous set of a semiconductor fin 2 and faceted semiconductor material portions 4 can collectively constitute a semiconductor nanowire (2, 4). As used herein, a "semiconductor nanowire" refers to a contiguous semiconductor material portion that extends along a lengthwise direction and having a maximum lateral dimension (the greatest of any dimension perpendicular to the lengthwise dimension) that does not exceed 100 nm. In one embodiment, each semiconductor nanowire (2, 4) can have a uniform vertical cross-sectional area along the lengthwise direction of the semiconductor nanowire (2, 4). In other words, the vertical cross-sectional area within planes perpendicular to the lengthwise direction of each semiconductor nanowire (2, 4) can be invariant under translation along the lengthwise direction of the semiconductor nanowire (2, 4).

For each semiconductor nanowire (2, 4), all physically exposed surfaces of the semiconductor nanowire (2, 4) are faceted surfaces that contact one another or one or more dielectric surfaces such as the top surface of the dielectric material layer 120. The formation of the plurality of semiconductor nanowires (2, 4) can be performed by performing the selective epitaxy process until all physically exposed surfaces of the semiconductor nanowire (2, 4) become faceted surfaces that contact one another or one or more dielectric surfaces. A predominant portion of all outer surfaces of each semiconductor nanowire (2, 4) can be a set of crystallographic facets that are not parallel to, or perpendicular to, a horizontal interface between the semiconductor nanowire (2, 4) and the buried insulator layer 120. As used herein, a "predominant portion" of a set of surfaces refers to any subset of surfaces that occupies more than 50% of the entirety of the areas of the set of surfaces. The set of crystallographic facets can be a set of faceted surfaces of the plurality of faceted semiconductor material portions 4. Each crystallographic facet of a semiconductor nanowire (2, 4) can be adjoined to at least another of the crystallographic facets on the same semiconductor nanowire (2, 4). In one embodiment, the growth of the plurality of faceted semiconductor material portions can be performed in a processing condition that prevents further growth of the plurality of faceted semiconductor material portions 4 after all faceted surfaces of the semiconductor nanowire (2, 4) contact one another or one or more dielectric surfaces.

Each semiconductor nanowire (2, 4) includes a semiconductor fin 2 and a plurality of faceted semiconductor material portions 4 located on sidewalls of the semiconductor fin 2. If the a semiconductor fin 2 include a parallel pair of vertical sidewalls that extend along a lengthwise direction, the plurality of faceted semiconductor material portions 4 can be formed on all surfaces of the parallel pair of vertical sidewalls.

Referring to FIGS. 3A-3D, a gate stack structure (30, 31, 32, 38) straddling the semiconductor nanowire (2, 4) is formed. The gate stack structure (30, 31, 32, 38) includes a stack of a gate dielectric 30 and a gate electrode (31, 32). The gate stack structure (30, 31, 32, 38) can be formed, for example, by deposition of gate stack layers and subsequent patterning of the gate stack layers.

Specifically, the gate stack layers can be subsequently deposited over the plurality of semiconductor nanowires (2, 4) and on the physically exposed portions of the top surface of the substrate 8. The gate stack layers can include a stack, from bottom to top, of a gate dielectric layer, at least one gate conductor layer, and optionally, a gate cap dielectric layer. Each of the gate stack layers can be a conformal material layer, i.e., can have a uniform thickness throughout. The gate stack structure (30, 31, 32, 38) is formed by patterning the gate stack layers. For example, the gate stack layers can be patterned by an anisotropic etch process employing a patterned photoresist (not shown) as a masking layer to form the gate stack structure (30, 31, 32, 38), which includes a gate dielectric 30, a gate conductor (31, 32), and optionally, a gate cap dielectric 38. In an illustrative example, the gate stack structure (30, 31, 32, 38) can include a gate dielectric 30, a lower gate conductor portion 31, an upper gate conductor portion 32, and a gate cap dielectric 38.

The gate dielectric layer, and consequently, the gate dielectric 30, can include a dielectric material, which can be silicon oxide, silicon nitride, silicon oxynitride, or a stack thereof. Alternately or additionally, the gate dielectric layer, and consequently, the gate dielectric 30, can include a high dielectric constant (high-k) material layer having a dielectric constant greater than 3.9. In one embodiment, the gate dielectric layer can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, although lesser and greater thicknesses can also be employed.

The gate conductor layer can be a single layer or a plurality of layers. In one embodiment, the gate conductor layer can include a lower gate conductor layer from which the lower gate conductor portion 31 is patterned and an upper gate conductor layer from which the upper gate conductor portion 32 is patterned. The gate conductor layer, and consequently, each of the lower and upper gate conductor portions (31, 32), can include a conductive material, which can be a doped semiconductor material, a metallic material, or a combination thereof. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by chemical vapor deposition (CVD), physical vapor deposition (PVD), or a combination thereof. For example, the metallic material can include aluminum and/or tungsten. The thickness of the gate conductor layer can be from 20 nm to 200 nm, although lesser and greater thicknesses can also be employed. In a non-limiting illustrative example, the lower gate conductor portion 31 can include a workfunction material, and the upper gate conductor portion 32 can include a doped semiconductor material.

If a gate cap dielectric layer is formed, the gate cap dielectric layer, and consequently, the gate cap dielectric portion 38 derived therefrom, can include a dielectric material such as silicon nitride, silicon oxide, organosilicate glass (OSG), a high dielectric constant (high-k) material layer that can be employed for the gate dielectric layer, or a combination thereof. The gate cap dielectric layer can be deposited, for example, by chemical vapor deposition or by any other deposition method known in the art. The thickness of the gate cap dielectric layer, if present, can be from 10 nm to 200 nm, and typically from 20 nm to 100 nm, although lesser and greater thicknesses can also be employed.

A photoresist layer is applied over the gate stack layers and is lithographically patterned. The pattern in the photoresist layer is transferred through the gate stack layers, for example, by an anisotropic that employs the patterned photoresist layer as an etch masks and employs the gate dielectric layer as an etch stop layer. Subsequently, physically exposed portions of the gate dielectric layer can be removed by an isotropic etch, which can be, for example, a wet etch.

Optionally, an anneal at an elevated temperature may be employed to partially, or fully, homogenize the first single crystalline semiconductor material in the semiconductor fin 2 and the second single crystalline semiconductor material in the plurality of faceted semiconductor material portions 4. In one embodiment, the semiconductor nanowire (2, 4) may be completely homogenized so that the composition of the semiconductor material is the same throughout each semiconductor nanowire (2, 4). In another embodiment, the semiconductor nanowire (2, 4) may be completely homogenized so that a composition gradient exists between surface positions of the semiconductor nanowire (2, 4) and inner portions of the semiconductor nanowire (2, 4). The temperature of the anneal can be, for example, in a range from 600° C. to 1,100° C. In yet another embodiment, an anneal may be avoided to maintain a difference in material composition across the semiconductor fin 2 and the plurality of faceted semiconductor material portions 4.

Referring to FIGS. 4A-4D, a gate spacer 52 can be formed around the gate stack structure (30, 31, 32, 38). The gate spacer 52 can be formed, for example, by conformal deposition of a dielectric material layer and an anisotropic etch that removes horizontal portions of the dielectric material layer. The remaining vertical portions of the dielectric material layer constitute the gate spacer 52.

Ion implantation of electrical dopants can be performed into the semiconductor nanowire (2, 4) employing masked ion implantation or employing unmasked ion implantation. The gate stack structure (30, 31, 32, 38) functions as a self-aligned implantation mask during the implantation process (es). The implanted portions of each semiconductor nanowire include a source region (2S, 4S) and a drain region (2D, 4D). The source region (2S, 4S) includes a fin source portion 2S and a facet-containing source portion 4S. The drain region (2D, 4D) includes a fin drain portion 2D and a facet-containing drain portion 4D. The unimplanted portions of each semiconductor nanowire further includes a body region (2B, 4B), which laterally contacts a source region (2S, 4S) and a drain region (2D, 4D).

Each body region (2B, 4B) includes a fin body portion 2B and a facet-containing body portion 4B. Within each semiconductor nanowire, the semiconductor fin (2S, 2D, 2B) includes the fin source portion 2S, the fin drain portion 2D, and the fin body portion 2B, and the plurality of faceted semiconductor material portions (4S, 4D, 4B) includes a facet-containing source portion 4S, a facet-containing drain portion 4D, and a facet-containing body portion 4B. Within each semiconductor nanowire (2S, 2D, 2B, 4S, 4D, 4B), the source region (2S, 4S) and the drain region (2D, 4D) are formed within end portions of the semiconductor nanowire (2S, 2B, 2D, 4S, 4B, 4D). Within each semiconductor nanowire (2S, 2D, 2B, 4S, 4D, 4B), the source region (2S, 4S) and the drain region (2D, 4D) are laterally spaced from each other by a body region (2B, 4B) underlying the gate stack structure (30, 31, 32, 38). Thus, each semiconductor nanowire (2S, 2D, 2B, 4S, 4D, 4B) can include a source region (2S, 4S) located at a first end portion of the semiconductor nanowire (2S, 2D, 2B, 4S, 4D, 4B), a drain region (2D, 4D) located at a second end portion of the semiconductor nanowire (2S, 2D, 2B, 4S, 4D, 4B) and is laterally spaced from the source region (2S, 4S), and a body region (2B, 4B) laterally contacting the source region (2S, 4S) and the drain region (2D, 4D) and underlying the gate stack structure (30, 31, 32, 38).

Referring to FIG. 5A-5D, a contact-level dielectric material layer 90 may be formed over the plurality of semiconductor nanowires (2S, 2D, 2B, 4S, 4D, 4B) and the gate stack structure (30, 31, 32, 38). Via cavities can be formed through the contact-level dielectric material layer 90, and can be filled with contact via structures 94. Optionally, metal semiconductor alloy portions 92 can be formed on surfaces of the facet-containing source portions 4S and the facet-containing drain portions 4D by reacting a metal with surface portions of the second single crystalline semiconductor material prior to formation of the contact via structures 94. Embodiments are expressly contemplated herein, in which the gate stack structures include disposable materials, and are replaced with replacement gate materials (including a gate dielectric material and a gate electrode material).

Figure 6A:
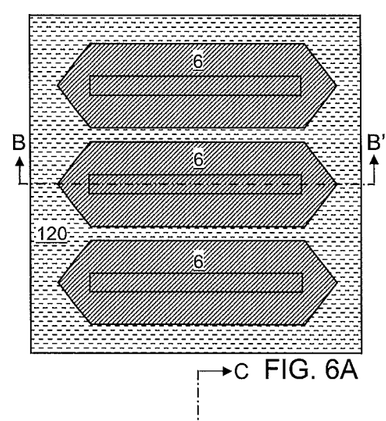
FIG. 6A is a top-down view of a second exemplary semiconductor structure after formation of a semiconductor shell region according to a second embodiment of the present disclosure.
Figure 6B:
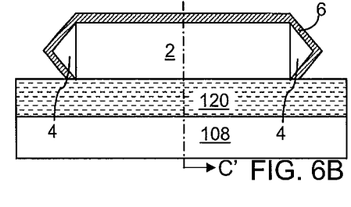
FIG. 6B is a vertical cross-sectional view of the second exemplary semiconductor structure along the plane B-B' of FIG. 6A.
Figure 6C:
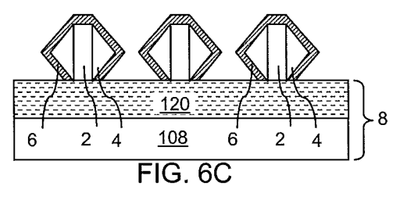
FIG. 6C is a vertical cross-sectional view of the second exemplary semiconductor structure along the plane C-C' of FIG. 6B.
Figure 7A:
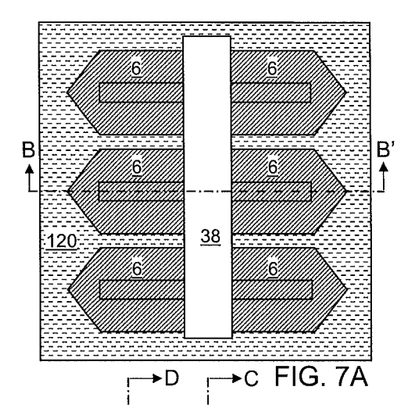
FIG. 7A is a top-down view of a second exemplary semiconductor structure after formation of a gate stack structure according to a second embodiment of the present disclosure.
Figure 7B:
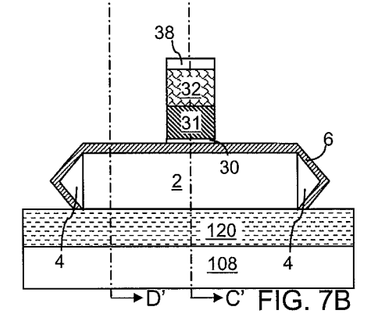
FIG. 7B is a vertical cross-sectional view of the second exemplary semiconductor structure along the plane B-B' of FIG. 7A.
Figure 7C:
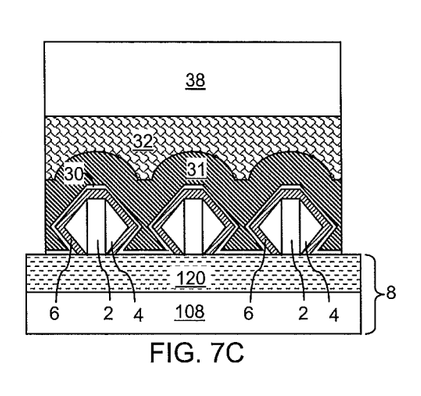
FIG. 7C is a vertical cross-sectional view of the second exemplary semiconductor structure along the plane C-C' of FIG. 7B.
Figure 7D:
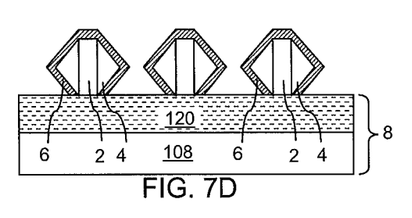
FIG. 7D is a vertical cross-sectional view of the second exemplary semiconductor structure along the plane D-D' of FIG. 7B.
Figure 8A:
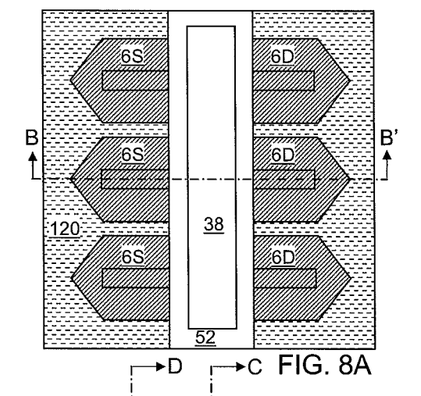
FIG. 8A is a top-down view of a second exemplary semiconductor structure after formation of a gate spacer and source and drain regions according to a second embodiment of the present disclosure.
Figure 8B:
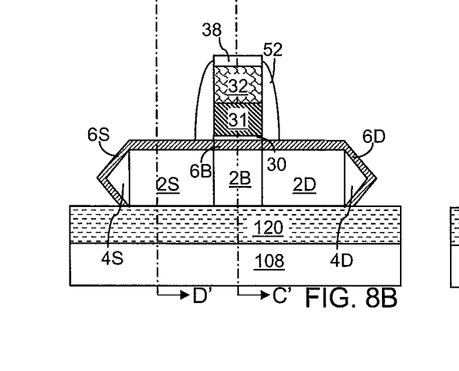
FIG. 8B is a vertical cross-sectional view of the second exemplary semiconductor structure along the plane B-B' of FIG. 8A.
Figure 8C:
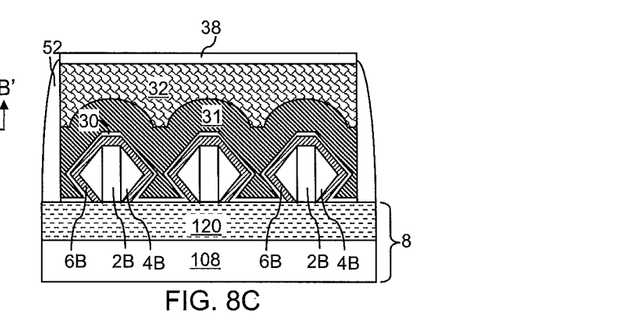
FIG. 8C is a vertical cross-sectional view of the second exemplary semiconductor structure along the plane C-C' of FIG. 8B.
Figure 8D:
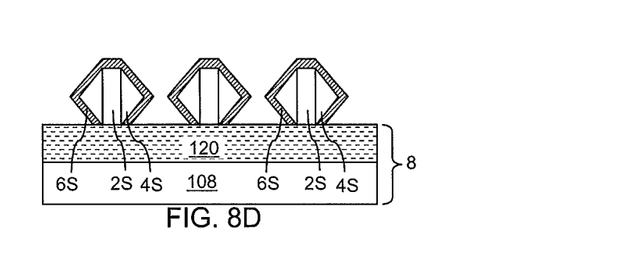
FIG. 8D is a vertical cross-sectional view of the second exemplary semiconductor structure along the plane D-D' of FIG. 8B.
Figure 9A:
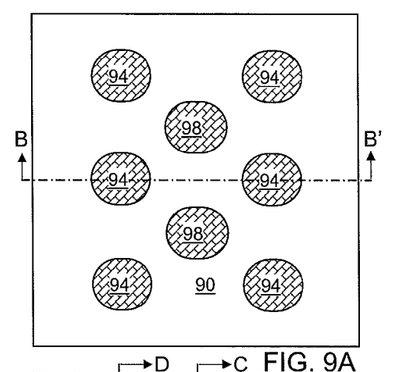
FIG. 9A is a top-down view of a second exemplary semiconductor structure after formation of a contact-level dielectric layer and various contact via structures according to a second embodiment of the present disclosure.
Figure 9B:
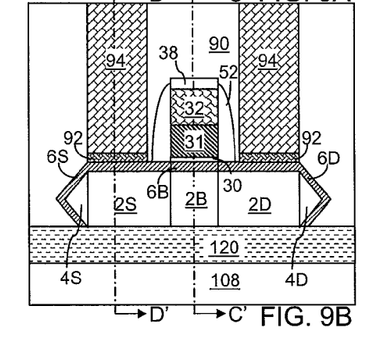
FIG. 9B is a vertical cross-sectional view of the second exemplary semiconductor structure along the plane B-B' of FIG. 9A.
Figure 9C:
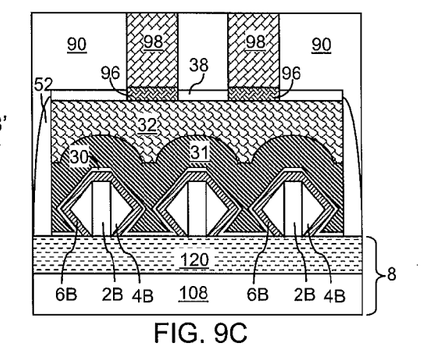
FIG. 9C is a vertical cross-sectional view of the second exemplary semiconductor structure along the plane C-C' of FIG. 9B.
Figure 9D:
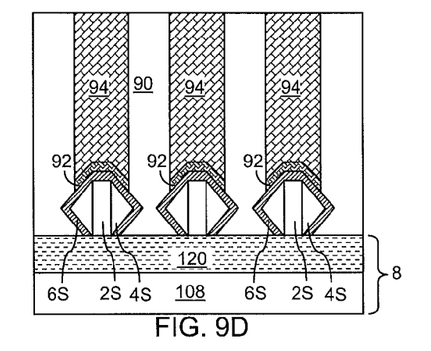
FIG. 9D is a vertical cross-sectional view of the second exemplary semiconductor structure along the plane D-D' of FIG. 9B.

Referring to FIGS. 6A-6C, a second exemplary semiconductor structure according to a second embodiment of the present disclosure by growing a semiconductor shell region 6 on physically exposed surfaces of the plurality of semiconductor fins 2 and the plurality of faceted semiconductor material portions 4. The semiconductor shell region 6 can be formed by growing an additional semiconductor material on all physically exposed surfaces of the semiconductor nanowire (2, 4). The additional semiconductor material is herein referred to as a third single crystalline semiconductor material. Each semiconductor shell region 6 is deposited as a single crystalline semiconductor material that is in epitaxial alignment with the single crystalline semiconductor materials of the underlying semiconductor fin (2, 4).

The growth of the semiconductor shell regions 6 from all of the physically exposed surfaces of the semiconductor nanowire (2, 4) can be effected by another selective epitaxy process, which is herein referred to as a second selective epitaxy process. The second selective epitaxy process employs a process condition that causes the third semiconductor material to grow in a direction perpendicular to the faceted surfaces.

During the second selective epitaxy process, the exemplary semiconductor structure including physically exposed surfaces of the plurality of semiconductor nanowires (2, 4) is loaded into a process chamber, and at least one reactant precursor for the third single crystalline semiconductor material and an etchant are flowed into the process chamber. The flow rate of the at least one reactant precursor for the third single crystalline semiconductor material and the flow rate of the etchant can be time-invariant (i.e., constant as a function of time), or can be modulated as a function of time.

The flow rate of the at least one reactant precursor for the third single crystalline semiconductor material and the flow rate of the etchant are selected such that the deposition of the third single crystalline semiconductor material proceeds selectively, i.e., proceeds on semiconductor surfaces and does not proceed on dielectric surfaces. Specifically, the etch rate for any semiconductor material that may nucleate on dielectric surfaces is grater than the rate of growth of a seed semiconductor material for nucleation on the dielectric surfaces is etched immediately, and does not result in a sustainable mechanism. As such, the at least one reactant precursor does not nucleate on any dielectric surface during the selective epitaxy process. The process conditions of the second selective epitaxy process can be selected such that the growth rate of the semiconductor shell regions 6 is dependent on the surface orientations of the physically exposed surfaces of the plurality of semiconductor nanowires (2, 4).

The composition of the third single crystalline semiconductor material can be the same as, or different from, the composition of the first single crystalline semiconductor material. Further, the composition of the third single crystalline semiconductor material can be the same as, or different from, the composition of the second single crystalline semiconductor material.

In one embodiment, the first single crystalline semiconductor material and the second single crystalline semiconductor material can be single crystalline silicon, and the third single crystalline semiconductor material can be a single crystalline silicon-germanium alloy. In this case, the second single crystalline semiconductor material can apply a tensile stress to the first and second single crystalline semiconductor materials.

In one embodiment, an atomic concentration of germanium in the third single crystalline semiconductor material can be in a range from 10% to 50%. In one embodiment, the first and/or second single crystalline semiconductor materials can include silicon at an atomic concentration of at least 90%. In one embodiment, the first and/or second single crystalline semiconductor materials can be doped or undoped silicon, or a doped or undoped silicon-germanium alloy in which the atomic concentration of silicon is at least 90%. In one embodiment, the first and/or second single crystalline semiconductor materials can consist of silicon or consist of silicon and at least one electrical dopant. If the first and/or second single crystalline semiconductor materials include a semiconductor material having a lattice constant lesser than the lattice constant of the third single crystalline semiconductor material, the third single crystalline semiconductor material in the semiconductor shell regions 6 can be under compressive strain. Channels to be formed in the semiconductor shell regions 6 can be under compressive strain, and the mobility of charge carriers therein is changed due to the compressive strain. In one embodiment, the compressive strain can be a biaxial compressive strain within a plane that is parallel to the most proximate faceted surface of the semiconductor nanowire (2, 4, 6). In one embodiment, the change in the mobility of charge carriers can be advantageously employed to increase the on-current of a field effect transistor. In one embodiment, p-type field effect transistors can be formed employing semiconductor shell regions 6 under compressive strain.

In another embodiment, the first and second single crystalline semiconductor material can be a single crystalline silicon-germanium alloy, and the third single crystalline semiconductor material can be single crystalline silicon. In this case, the third single crystalline semiconductor material can apply a compressive stress to the first and second single crystalline semiconductor materials.

In one embodiment, an atomic concentration of germanium in the first and/or second single crystalline semiconductor materials can be in a range from 10% to 50%. In one embodiment, the third single crystalline semiconductor material can include silicon at an atomic concentration of at least 90%. In one embodiment, the third single crystalline semiconductor material can be doped or undoped silicon, or a doped or undoped silicon-germanium alloy in which the atomic concentration of silicon is at least 90%. In one embodiment, the third single crystalline semiconductor material can consist of silicon or consist of silicon and at least one electrical dopant.

In still another embodiment, one or more of the first, second, and third single crystalline semiconductor materials can include a compound semiconductor material.

In one embodiment, the atomic concentration of germanium in the first single crystalline semiconductor materials can be less than 10% and the atomic concentration of silicon in the first single crystalline semiconductor material can be greater than 90%. The first single crystalline semiconductor material can be a single crystalline silicon material. The second single crystalline semiconductor material as deposited may be a silicon-germanium alloy having an atomic concentration of germanium greater than 10% or may be a single crystalline germanium material. Each semiconductor nanowire (2, 4) may be annealed to interdiffuse the first and second single crystalline semiconductor materials prior to formation of the semiconductor shell regions 6. After the anneal, the semiconductor nanowire (2, 4) includes a single crystalline silicon-germanium alloy material, which may be homogenized (i.e., have a uniform composition throughout) or may have a concentration gradient therein. The single crystalline silicon-germanium alloy material is an alloy of the first single crystalline semiconductor material and the second single crystalline semiconductor material. A semiconductor shell region 6 is added to each semiconductor nanowire (2, 4). The third single crystalline semiconductor material of the semiconductor shell region 6 can have a different composition than the alloy of the first and second single crystalline semiconductor materials within the semiconductor nanowire (2, 4, 6) that incorporates the semiconductor shell region 6. In one embodiment, the third single crystalline semiconductor material can be single crystalline silicon. In this case, the semiconductor shell regions 6 can be under tensile strain. Channels to be formed in the semiconductor shell regions 6 can be under tensile strain, and the mobility of charge carriers therein is changed due to the tensile strain. In one embodiment, the tensile strain can be a biaxial tensile strain within a plane that is parallel to the most proximate faceted surface of the semiconductor nanowire (2, 4, 6). In one embodiment, the change in the mobility of charge carriers can be advantageously employed to increase the on-current of a field effect transistor. In one embodiment, n-type field effect transistors can be formed employing semiconductor shell regions 6 under tensile strain.

If the third single crystalline semiconductor material is different from the first single crystalline semiconductor material and/or the second single crystalline semiconductor material, the semiconductor shell regions 6 can have a different charge carrier mobility than the semiconductor fin 2 or the plurality of faceted semiconductor material portions 4.

In one embodiment, the at least one reactant precursor can include at least one silicon-containing precursor and/or at least one germanium-containing precursor. For example, the at least one silicon-containing precursor can include at least one of $SiH_4$, $SiH_2Cl_2$, $SiHCl_3$, $SiCl_4$, and $Si_2H_6$. The at least one germanium-containing precursor can include at least one of $GeH_4$ and $Ge_2H_6$. The etchant can include HCl.

In one embodiment, the molar ratio of the at least one reactant precursor (i.e., all of the at least one reactant precursor) to the etchant is in a range from 4:1 to 1:5 in the process chamber during the selective epitaxy process. The pressure of the selective epitaxy process is maintained in a range that provides substantially same growth rates for different crystallographic surfaces of the third single crystalline semiconductor material. As used herein, a plurality of growth rates are substantially the same if the least growth rate among the plurality of growth rates is greater than ⅔ of the greatest growth rate among the plurality of growth rates. In one embodiment, the partial pressure of the etchant can be in a range from 1 Torr to 50 Torr, and the partial pressure of all of the at least one reactant precursor is in a range from 2 Torr to 20 Torr, although lesser and greater partial pressures can also be employed for the etchant and/or the at least one reactant precursor.

At least one carrier gas may optionally be employed. Exemplary gases that may be employed as a carrier gas include, but are not limited to, hydrogen, nitrogen, helium, and argon. The total pressure in the process chamber can be in a range from 20 Torr to 200 Torr, although lesser and greater total pressures can also be employed. The temperature of the process chamber during the second selective epitaxy process can be in a range from 600° C. to 900° C., although lesser and greater temperatures can also be employed. A semiconductor shell region 6 is added to each semiconductor nanowire (2, 4, 6) by the second selective epitaxy process.

In one embodiment, the process parameters of the second selective epitaxy process can be controlled such that semiconductor shell regions 6 formed on different contiguous combinations of a semiconductor fin 2 and faceted semiconductor material portions 4 do not contact each other. This feature can be advantageously employed to prevent electrically shorting a plurality of semiconductor nanowires (2, 4, 6) including the semiconductor shell regions 6 while growing a semiconductor shell region 6 on each contiguous combination of a semiconductor fin 2 and faceted semiconductor material portions 4 (i.e., a semiconductor nanowire (2, 4) prior to growth of the semiconductor shell regions 6) through selective epitaxy of the third single crystalline semiconductor material.

Each semiconductor nanowire (2, 4, 6) is located on the buried insulator layer 120. A predominant portion of all outer surfaces of the semiconductor nanowire (2, 4, 6) is a set of crystallographic facets that are not parallel to, or perpendicular to, a horizontal interface between the semiconductor fin 2 and the buried insulator layer 120.

The semiconductor shell regions 6 constitute another plurality of faceted semiconductor material portions that are located on the plurality of faceted semiconductor material portions 4 located directly on sidewalls of the semiconductor fin 2. Each semiconductor shell region 6 is in contact with, and laterally surrounds, the plurality of faceted semiconductor material portions 4 located on a same semiconductor fin 2. For each semiconductor nanowire (2, 4, 6), a semiconductor shell region 6 therein and the buried insulator layer 120 encapsulate a semiconductor fin 2 and the plurality of faceted semiconductor material portions 4 thereupon.

Referring to FIGS. 7A-7D, the processing steps of FIGS. 3A-3D can be performed to form a gate stack structure (30, 31, 32, 38). The gate stack structure (30, 31, 32, 38) is formed across the plurality of semiconductor nanowires (2, 4, 6). The gate stack structure (30, 31, 32, 38) includes a stack of a gate dielectric 30 and a gate electrode (31, 32).

Referring to FIGS. 8A-8D, a gate spacer 52, a source region (2S, 4S, 6S) and a drain region (2D, 4D, 6D) can be formed employing the same processing steps as the processing steps of FIGS. 4A-4D. Specifically, ion implantation of electrical dopants can be performed into the semiconductor nanowire (2, 4, 6) and the employing masked ion implantation or employing unmasked ion implantation. The gate stack structure (30, 31, 32, 38) functions as a self-aligned implantation mask during the implantation process(es). The implanted portions of each semiconductor nanowire include a source region (2S, 4S, 6S) and a drain region (2D, 4D, 6D). The source region (2S, 4S, 6S) includes a fin source portion 2S, a facet-containing source portion 4S, and a shell source region 6S. The drain region (2D, 4D) includes a fin drain portion 2D, a facet-containing drain portion 4D, and a shell drain region 6D. The unimplanted portions of each semiconductor nanowire further includes a body region (2B, 4B, 6B), which laterally contacts a source region (2S, 4S, 6S) and a drain region (2D, 4D, 6D).

Each body region (2B, 4B, 6B) includes a fin body portion 2B, a facet-containing body portion 4B, and a shell body region 6B. The shell body region including the third single crystalline semiconductor material can include the channel region of a field effect transistor. Within each semiconductor nanowire, the semiconductor fin (2S, 2D, 2B) includes the fin source portion 2S, the fin drain portion 2D, and the fin body portion 2B; the plurality of faceted semiconductor material portions (4S, 4D, 4B) includes a facet-containing source portion 4S, a facet-containing drain portion 4D, and a facet-containing body portion 4B; and the semiconductor shell region (6S, 6D, 6B) includes a shell source region 6S, a shell drain region 6D, and a shell body region 6B.

Within each semiconductor nanowire (2S, 2D, 2B, 4S, 4D, 4B, 6S, 6D, 6B), the source region (2S, 4S, 6S) and the drain region (2D, 4D, 6D) are formed within end portions of the semiconductor nanowire (2S, 2D, 2B, 4S, 4D, 4B, 6S, 6D, 6B). Within each semiconductor nanowire (2S, 2D, 2B, 4S, 4D, 4B, 6S, 6D, 6B), the source region (2S, 4S, 6S) and the drain region (2D, 4D, 6D) are laterally spaced from each other by a body region (2B, 4B, 6B) underlying the gate stack structure (30, 31, 32, 38). Thus, each semiconductor nanowire (2S, 2D, 2B, 4S, 4D, 4B, 6S, 6D, 6B) can include a source region (2S, 4S, 6S) located at a first end portion of the semiconductor nanowire (2S, 2D, 2B, 4S, 4D, 4B, 6S, 6D, 6B), a drain region (2D, 4D, 6D) located at a second end portion of the semiconductor nanowire (2S, 2D, 2B, 4S, 4D, 4B, 6S, 6D, 6B) and is laterally spaced from the source region (2S, 4S, 6S), and a body region (2B, 4B, 6B) laterally contacting the source region (2S, 4S, 6S) and the drain region (2D, 4D, 6D) and underlying the gate stack structure (30, 31, 32, 38).

Referring to FIG. 9A-9D, a contact-level dielectric material layer 90 may be formed over the plurality of semiconductor nanowires (2S, 2D, 2B, 4S, 4D, 4B, 6S, 6D, 6B) and the gate stack structure (30, 31, 32, 38). Via cavities can be formed through the contact-level dielectric material layer 90, and can be filled with contact via structures 94. Optionally, metal semiconductor alloy portions 92 can be formed on surfaces of the shell source region 6S and the shell drain region 6D by reacting a metal with surface portions of the second single crystalline semiconductor material prior to formation of the contact via structures 94. Embodiments are expressly contemplated herein, in which the gate stack structures include disposable materials, and are replaced with replacement gate materials (including a gate dielectric material and a gate electrode material).

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A semiconductor structure comprising:
a semiconductor nanowire located on an insulator layer, wherein said semiconductor nanowire comprises a semiconductor fin, a plurality of faceted semiconductor material portions located on sidewalls of said semiconductor fin and covering entire surfaces of said sidewalls of said semiconductor fin, and a semiconductor shell region laterally surrounding said plurality of faceted semiconductor material portions and directly contacting said plurality of faceted semiconductor material portions and a topmost surface of said semiconductor fin, said semiconductor shell region comprising a single crystalline semiconductor material; and
a gate stack structure including a stack of a gate dielectric and a gate electrode and straddling said semiconductor nanowire.

2. The semiconductor structure of claim 1, wherein said plurality of faceted semiconductor material portions are not parallel to, or perpendicular to, a horizontal interface between said semiconductor nanowire and said insulator layer.

3. The semiconductor structure of claim 2, wherein said plurality of faceted semiconductor material portions have faceted surfaces oriented in a {111} plane.

4. The semiconductor structure of claim 1, wherein said semiconductor fin comprises a first single crystalline semiconductor material, and said plurality of faceted semiconductor material portions comprise a second single crystalline semiconductor material that is different from said first single crystalline semiconductor material.

5. The semiconductor structure of claim 1, wherein said plurality of faceted semiconductor material portion is under compressive strain or is under tensile strain.

6. The semiconductor structure of claim 1, wherein said semiconductor shell region and said insulator layer encapsulate said semiconductor fin and said plurality of faceted semiconductor material portions.

7. The semiconductor structure of claim 1, wherein said semiconductor shell region is under a compressive strain or is under a tensile strain.

8. The semiconductor structure of claim 1, wherein said semiconductor nanowire comprises:
a source region located at a first end portion of said semiconductor nanowire;
a drain region located at a second end portion of said semiconductor nanowire and is laterally spaced from said source region; and
a body region laterally contacting said source region and said drain region and underlying said gate stack structure.

9. The semiconductor structure of claim 1, wherein said single crystalline semiconductor material of said semiconductor shell region is different from the first single crystalline semiconductor material and/or the second single crystalline semiconductor material.

10. A semiconductor structure comprising:
a substrate including an insulator layer; and
a plurality of semiconductor nanowires located on a top surface of said said insulator layer, wherein said plurality of semiconductor nanowires is not in contact with each other, and wherein each of said plurality of semiconductor nanowires comprises a semiconductor fin, a plurality of faceted semiconductor material portions presented on entire sidewalls of said semiconductor fin, and a semiconductor shell region laterally surrounding said plurality of faceted semiconductor material portions and directly contacting said plurality of faceted semiconductor material portions and a topmost surface of said semiconductor fin, said semiconductor shell region comprising a single crystalline semiconductor material.

11. The semiconductor structure of claim 10, wherein said plurality of faceted semiconductor material portions are not parallel to, or perpendicular to, a horizontal interface between said plurality of semiconductor nanowires and said insulator layer.

12. The semiconductor structure of claim 11, wherein said plurality of faceted semiconductor material portions have faceted surfaces oriented in a {111} plane.

13. The semiconductor structure of claim 10, wherein said semiconductor fin comprises a first single crystalline semiconductor material, and said plurality of faceted semiconductor material portions comprise a second single crystalline semiconductor material that is same or different from said first single crystalline semiconductor material, wherein said single crystalline semiconductor material of said semiconductor shell region is different from said first single crystalline semiconductor material and/or said second single crystalline semiconductor material.

\* \* \* \* \*